(12) United States Patent
Seo et al.

(10) Patent No.: US 12,364,145 B2
(45) Date of Patent: Jul. 15, 2025

(54) DISPLAY DEVICE AND METHOD OF MANUFACTURING DISPLAY DEVICE

(71) Applicant: Samsung Display Co., Ltd., Yongin-Si (KR)

(72) Inventors: Hyunsang Seo, Yongin-si (KR); Doohyoung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 437 days.

(21) Appl. No.: 17/944,361

(22) Filed: Sep. 14, 2022

(65) Prior Publication Data

US 2023/0006180 A1    Jan. 5, 2023

Related U.S. Application Data

(62) Division of application No. 16/988,807, filed on Aug. 10, 2020, now Pat. No. 11,469,400.

(30) Foreign Application Priority Data

Feb. 21, 2020    (KR) .................. 10-2020-0021763

(51) Int. Cl.
*H10K 59/80*    (2023.01)
*H10K 50/842*    (2023.01)
(Continued)

(52) U.S. Cl.
CPC ..... *H10K 59/8722* (2023.02); *H10K 50/8426* (2023.02); *H10K 50/844* (2023.02);
(Continued)

(58) Field of Classification Search
CPC ........... H10K 59/8722; H10K 50/8426; H10K 50/844; H10K 59/873; H10K 71/00;
(Continued)

(56) References Cited

U.S. PATENT DOCUMENTS 7,630,122 B2    12/2009    Uchida
7,851,996 B2    12/2010    Nakamura et al.
(Continued)

FOREIGN PATENT DOCUMENTS

CN    1967866 A    5/2007
CN    108010436 A    5/2018
(Continued)

OTHER PUBLICATIONS

Chinese Office Action corresponding to Application No. 202011134344.3 and issued on Nov. 11, 2024, 10 pages.

*Primary Examiner* — Thanh T Nguyen

(74) *Attorney, Agent, or Firm* — Innovation Counsel LLP

(57) ABSTRACT

A display device includes: a first substrate including a first through hole, a display area, and a non-display area, the display area surrounding the first through hole, and the non-display area surrounding at least a portion of the display area; an inorganic insulating layer arranged in the display area; a display element layer including a display element and arranged on the inorganic insulating layer; a second substrate including a second through hole and arranged on the display element layer, the second through hole being connected to the first through hole; and a blocking member arranged along an inner surface of the first through hole and the second through hole, and extending from the first substrate to the second substrate, wherein the inorganic insulating layer extends from the display area to the inner surface of the first through hole.

7 Claims, 18 Drawing Sheets

(51) Int. Cl.
  *H10K 50/844* (2023.01)
  *H10K 59/65* (2023.01)
  *H10K 71/00* (2023.01)
  *H10K 102/00* (2023.01)

(52) U.S. Cl.
  CPC ........... *H10K 59/873* (2023.02); *H10K 71/00* (2023.02); *H10K 59/65* (2023.02); *H10K 2102/00* (2023.02)

(58) Field of Classification Search
  CPC .... H10K 59/65; H10K 2102/00; H10K 59/60; H10K 59/1213; H10K 59/123; H10K 59/126; H10K 59/38; H10K 59/122; H10K 59/00; H10K 50/865; H10K 59/12; H10H 29/142
  See application file for complete search history.

(56) References Cited

U.S. PATENT DOCUMENTS

| | | | |
|---|---|---|---|
| 10,499,476 B2 | 12/2019 | Kwon et al. | |
| 10,847,599 B2 | 11/2020 | Jeon et al. | |
| 10,903,293 B2 | 1/2021 | Jeong et al. | |
| 10,916,595 B2 | 2/2021 | Park et al. | |
| 11,011,595 B2 | 5/2021 | Lee et al. | |
| 11,054,950 B2 | 7/2021 | Eom et al. | |
| 11,374,193 B2 * | 6/2022 | Choi | H10K 71/621 |
| 2016/0226030 A1 | 8/2016 | Heo | |
| 2017/0214003 A1 * | 7/2017 | Lee | H10K 59/121 |
| 2017/0344053 A1 | 11/2017 | Kim et al. | |
| 2018/0124898 A1 | 5/2018 | Kwon et al. | |
| 2018/0159075 A1 | 6/2018 | Kim et al. | |
| 2018/0240849 A1 * | 8/2018 | Kao | H10D 30/6755 |
| 2019/0064875 A1 | 2/2019 | Ahn et al. | |
| 2019/0214600 A1 | 7/2019 | Park et al. | |
| 2019/0245160 A1 | 8/2019 | Yoon et al. | |
| 2019/0252475 A1 | 8/2019 | Sung et al. | |
| 2019/0258096 A1 | 8/2019 | Chien | |
| 2020/0052054 A1 | 2/2020 | Park et al. | |
| 2020/0220101 A1 * | 7/2020 | Moon | H10K 77/111 |
| 2020/0358024 A1 * | 11/2020 | Choi | H10K 59/80521 |

FOREIGN PATENT DOCUMENTS

| | | |
|---|---|---|
| CN | 110277512 A | 9/2019 |
| CN | 110660930 A | 1/2020 |
| JP | 2012-048097 A | 3/2012 |
| KR | 10-2017-0136053 A | 12/2017 |
| KR | 10-2017-0137230 A | 12/2017 |
| KR | 10-2018-0063962 A | 6/2018 |
| KR | 10-2019-0023008 A | 3/2019 |
| KR | 10-2019-0073695 A | 6/2019 |
| KR | 10-2019-0098703 A | 8/2019 |
| KR | 1020200005706 A | 1/2020 |
| KR | 1020200015868 A | 2/2020 |

* cited by examiner

DISPLAY DEVICE AND METHOD OF MANUFACTURING DISPLAY DEVICE

CROSS-REFERENCE TO RELATED APPLICATION

This application is a divisional application of U.S. patent application Ser. No. 16/988,807 filed on Aug. 10, 2020, which claims the benefit of Korean Patent Application No. 10-2020-0021763, filed on Feb. 21, 2020, in the Korean Intellectual Property Office, the disclosure of which is incorporated herein in its entirety by reference.

BACKGROUND

1. Field

One or more embodiments relate to a display device and a method of manufacturing a display device, and more particularly, to a display device including a transmission area inside a display area, and a method of manufacturing a display device.

2. Description of Related Art

Recently, use of display devices has diversified. In addition, as display devices have become thinner and lighter, their range of use has gradually been extended.

As the area occupied by a display area in display devices expands, various functions that are combined or associated with display devices have been added. In order to add various functions while expanding the area, display devices may include a region for adding various functions inside a display area as well as a function of displaying an image.

Particularly, the display devices may include a transmission area through which light may pass inside a display area and may arrange a component therebelow. Research has been carried out on display devices preventing distortion of light, etc. incident to the component.

SUMMARY

One or more embodiments include a display device and a method of manufacturing a display device which raise transmittance of a transmission area and prevent distortion of light, etc. incident to the component.

Additional aspects will be set forth in part in the description which follows and, in part, will be apparent from the description, or may be learned by practice of the presented embodiments of the disclosure.

According to one or more embodiments, a display device includes a first substrate including a first through hole, a display area, and a non-display area, the display area surrounding the first through hole, and the non-display area surrounding at least a portion of the display area, an inorganic insulating layer arranged in the display area, a display element layer including a display element and arranged on the inorganic insulating layer, a second substrate including a second through hole and arranged on the display element layer, the second through hole being connected to the first through hole, and a blocking member arranged along an inner surface of the first through hole and the second through hole, and extending from the first substrate to the second substrate, wherein the inorganic insulating layer extends from the display area to the inner surface of the first through hole.

The display element may include a pixel electrode and an opposite electrode, and the opposite electrode may extend from the display area to the inner surface of the first through hole.

The display element layer may further include an organic insulating layer arranged between the inorganic insulating layer and the opposite electrode, and the inorganic insulating layer may contact the opposite electrode on the inner surface of the first through hole.

The display element layer may further include an inorganic encapsulation layer covering the display element, wherein the inorganic encapsulation layer may extend from the display area to the inner surface of the first through hole.

The display device may further include an optical functional layer disposed on the second substrate and including a third through hole connected to the second through hole, wherein the blocking member may extend from the second substrate to the optical functional layer.

The display device may further include a cover window disposed on the optical functional layer and covering the display area and the third through hole, and an adhesive layer arranged between the optical functional layer and the cover window and including a fourth through hole connected to the third through hole.

A size of the fourth through hole may be greater than a size of the third through hole, and the blocking member may extend to an upper surface of the optical functional layer.

The blocking member may include a black pigment.

The blocking member may include a moisture-proof insulating material.

The blocking member may cover the inorganic insulating layer extending to the inner surface of the first through hole.

At least one of the first substrate and the second substrate may include glass.

The display device may further include a component arranged to pass through the first through hole and the second through hole.

The display device may further include an optical functional layer disposed on the second substrate and including a third through hole connected to the second through hole, and a cover window disposed on the optical functional layer and covering the display area and the third through hole, wherein the component may be arranged to pass through the third through hole.

According to one or more embodiments, a method of manufacturing a display device includes preparing a first substrate in which a first through hole is formed, forming an inorganic insulating layer on the first substrate, forming a display element layer on the inorganic insulating layer, the display element layer including a display element, preparing a second substrate in which a second through hole is formed, aligning the first substrate and the second substrate such that the first through hole corresponds to the second through hole, and forming a blocking member along an inner surface of the first through hole and an inner surface of the second through hole.

The inorganic insulating layer may extend from the display area to the inner surface of the first through hole.

The blocking member may cover the inorganic insulating layer extending to the inner surface of the first through hole.

The forming of the display element layer may include forming an inorganic encapsulation layer on the display element layer, wherein the inorganic encapsulation layer may extend from the display area to the inner surface of the first through hole.

The method may further include forming an optical functional layer on the second substrate, the optical functional layer including a third through hole connected to the second through hole, forming an adhesive layer on the optical functional layer, the adhesive layer including a fourth through hole connected to the third through hole, and arranging a cover window on the adhesive layer, the cover window covering the display area and the fourth through hole.

A size of the fourth through hole may be greater than a size of the third through hole, and the blocking member may extend from the inner surface of the second through hole to an upper surface of the optical functional layer.

The method may further include arranging a component such that the component passes through the first through hole and the second through hole.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
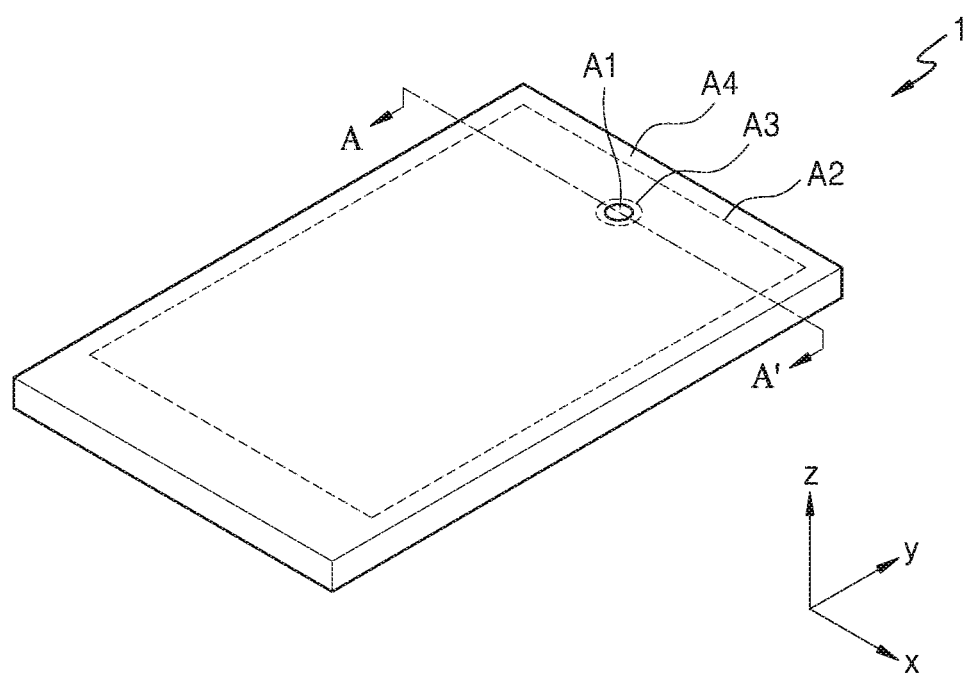
FIG. 1 is a perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the present disclosure are described in detail with reference to the accompanying drawings. When description is made with reference to the drawings, like reference numerals are used for like or corresponding elements and repeated descriptions thereof are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

FIG. 1 is a perspective view of a display device 1 according to an embodiment.

Referring to FIG. 1, the display device 1 may be various electronic apparatuses such as mobile phones, tablet personal computers, notebook computers, and smartwatches. The display device 1 may include a first area A1 and a second area A2, the second area A2 surrounding the first area A1. A plurality of pixels, for example, an array of pixels may be arranged in the second area A2. The second area A2 may display an image using the array of pixels. Therefore, the second area A2 corresponds to a display area on which an image may be displayed. The first area A1 may be entirely surrounded by the second area A2. The first area A1 may include a region in which components which provide various functions to the display device 1 is arranged. For example, in the case where the component includes a sensor, a camera, etc. that use light, the first area A1 corresponds to a transmission area through which light of the sensor or light progressing to the camera may pass. In this case, a substrate of the display device 1 may include a through hole corresponding to the first area A1 to improve a transmittance of light progressing to the component.

In an embodiment, the first area A1 may have a circular shape. In another embodiment, the first area A1 may have a polygonal shape. In another embodiment, the first area A1 may have an elliptical shape. Hereinafter, the case where the first area A1 has a circular shape is mainly described in detail.

A third area A3 may be arranged between the first area A1 and the second area A2. The third area A3 may include a non-display area. Wirings that detour around the first area A1 may be arranged in the third area A3. Like the third area A3, a fourth area A4 surrounding the second area A2 may include a non-display area in which pixels are not arranged. Various kinds of wirings and a built-in circuit, etc. may be arranged in the fourth area A4.

Each pixel of the display device 1 may include a light-emitting diode as a display element that may emit light having a predetermined color. The light-emitting diode may include an organic light-emitting diode that includes an organic material as an emission layer. Alternatively, the light-emitting diode may include an inorganic light-emitting diode. Alternatively, the light-emitting diode may include quantum dots as the emission layer. Hereinafter, for convenience of description, the case where a light-emitting diode includes an organic light-emitting diode is described.

Though it is shown in FIG. 1 that the first area A1 is arranged at the central portion of the second area A2 in a width direction (e.g. a ±x-direction) of the display device 1, the first area A1 may be arranged offset on the left or the right in the width direction of the display device 1 in another embodiment. In addition, the first area A1 may be arranged on the top side, arranged on the center, or arranged on the bottom side in a lengthwise direction (e.g. a ±y-direction) of the display device 1. The first area A1 may be arranged on various locations.

Though it is shown in FIG. 1 that the display device 1 includes one first area A1, the display device 1 may include a plurality of first areas A1 in another embodiment.

Figure 2A:
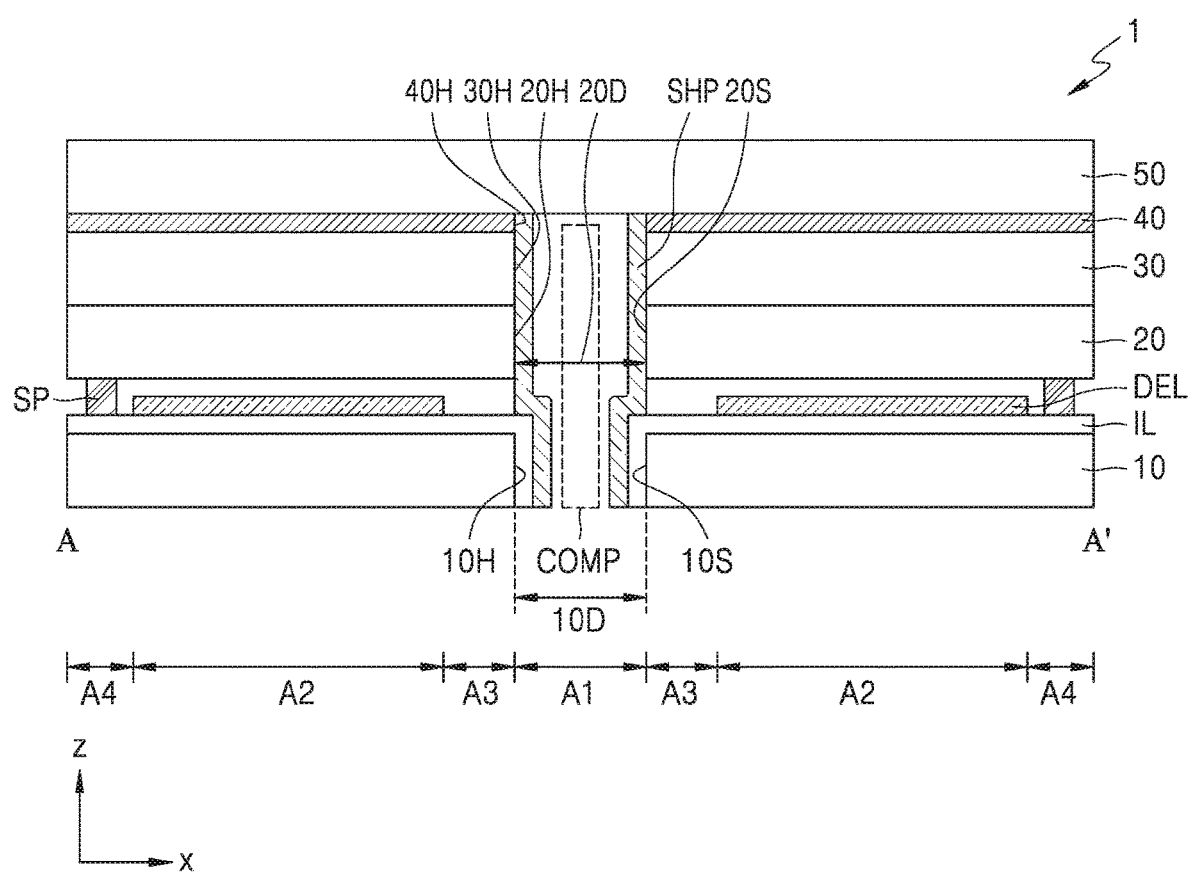
FIG. 2A is a cross-sectional view of a display device taken along line A-A' of FIG. 1 according to an embodiment.

FIG. 2A is a cross-sectional view of the display device 1 taken along line A-A' of FIG. 1 according to an embodiment.

Referring to FIG. 2A, the display device 1 may include a first substrate 10, an inorganic insulating layer IL, a display element layer DEL, a sealing member SP, a second substrate 20, an optical functional layer 30, an adhesive layer 40, a cover window 50, a blocking member SHP, and a component COMP.

The first substrate 10 may include the second area A2 and the fourth area A4, the second area A2 surrounding a first through hole 10H, and the fourth area A4 surrounding at least a portion of the second area A2. In this case, the first through hole 10H may be formed corresponding to the first area A1. In addition, a plurality of organic light-emitting diodes as display elements may be arranged in the second area A2 of the first substrate 10.

The inorganic insulating layer IL may be arranged on the first substrate 10. Specifically, the inorganic insulating layer IL may extend from the second area A2 to an inner surface 10S of the first through hole 10H. Here, the inner surface 10S of the first through hole 10H may include a surface of the first substrate 10 that is exposed by the first through hole 10H. The inorganic insulating layer IL may include an inorganic insulating material.

The display element layer DEL may include display elements and be arranged on the inorganic insulating layer IL. The display element layer DEL may include a plurality of display elements which display an image. The display element layer DEL may also include an organic insulating layer.

The second substrate 20 may be arranged over the first substrate 10 and may include a second through hole 20H connected to the first through hole 10H. In this case, the second through hole 20H may be formed in a region corresponding to the first through hole 10H in a plan view. In an embodiment, the size of the second through hole 20H may equal to the size of the first through hole 10H. In this case, the size of the first through hole 10H may be an area of a cross-section of the first through hole 10H that is perpendicular in a z-direction. The size of the second through hole 20H may be an area of a cross-section of the second through hole 20H that is perpendicular in the z-direction. In FIG. 2A, for convenience of description, the size of the first through hole 10H and the size of the second through hole 20H are respectively illustrated as a diameter 10D of the first through hole 10H and a diameter 20D of the second through hole 20H. In this case, the diameter 10D of the first through hole 10H may be equal to the diameter 20D of the second through hole 20H. In an embodiment, the diameter 10D of the first through hole 10H may be less than the diameter 20D of the second through hole 20H.

The second substrate 20 may include a transparent member to display an image from the second area A2 and prevent penetration of oxygen and moisture into the second area A2. In an embodiment, the second substrate 20 may include a touch screen panel including an input sensing portion to serve as a touch panel.

The second substrate 20 may be coupled to the first substrate 10 by using the sealing member SP arranged on the edge of the first substrate 10.

The sealing member SP may be arranged in the fourth area A4 while surrounding the second area A2. The sealing member SP may attach the first substrate 10 to the second substrate 20 and prevent the introduction of oxygen, moisture, etc. into the second area A2. In addition, the sealing member SP may attach the first substrate 10 to the second substrate 20 to improve mechanical strength.

In an embodiment, the sealing member SP may include sealant. In another embodiment, the sealing member SP may include a material hardened by a laser. For example, the sealing member SP may include frit. Specifically, the sealing member SP may include a urethane-based resin, an epoxy-based resin, and an acryl-based resin, which are organic sealant, or silicon which is an inorganic sealant. For a urethane-based resin, a urethane acrylate, etc. may be used, for example. For an acryl-based resin, butyl acrylate, ethylhexyl acrylate, etc. may be used, for example. The sealing member SP may include a material that is hardened by heat.

The optical functional layer 30 may be arranged on the second substrate 20 and may include the third through hole 30H connected to the second through hole 20H. In this case, the third through hole 30H may be formed in a region corresponding to the second through hole 20H and the first through hole 10H in a plan view.

The optical functional layer 30 may include a reflection prevention layer. The reflection prevention layer may reduce reflectivity of light (external light) incident toward the first substrate 10 from the outside through the window 50. The reflection prevention layer may include a retarder and/or a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. The retarder and the polarizer may further include a protective film.

In another embodiment, the optical functional layer 30 may include a black matrix and color filters. The color filters may be arranged by taking into account colors of light respectively emitted from pixels of the display device 1. Each of the color filters may include red, green, or blue pigment or dye. Alternatively, each of the color filters may not include above-described pigment or dye and may include scattering particles such as titanium oxide.

In an embodiment, the optical functional layer 30 may include a destructive interference structure. The destructive interference structure may include a first reflective layer and a second reflective layer arranged on different layers. First-reflected light and second-reflected light respectively reflected by the first reflective layer and the second reflective layer may be destructively interfered and thus reflectivity of external light may be reduced.

The adhesive layer 40 may be arranged on the optical functional layer 30 and may include a fourth hole 40H connected to the third through hole 30H. In this case, the through hole 40H may be formed in a region corresponding to the third through hole 30H in a plan view. The adhesive layer 40 may include an optical clear adhesive (OCA). Alternatively, the adhesive layer 40 may employ a general material known to the art without limitation.

The cover window 50 may be arranged on the optical functional layer 30. The cover window 50 may cover the second area A2 and the third through hole 30H. Particularly, the cover window 50 may be arranged on the adhesive layer 40 and may cover the fourth through hole 40H. The cover window 50 may include glass, sapphire, or plastic. For example, the cover window 50 may include ultra thin glass (UTG) or colorless polyimide (CPI).

The blocking member SHP may be arranged along the inner surface 10S of the first through hole 10H. For example, in the case where the first through hole 10H has a circular shape, the blocking member SHP may be arranged in a ring shape in a plan view.

The blocking member SHP may extend from the first substrate 10 to the second substrate 20. Specifically, the blocking member SHP may be arranged along the inner surface 10S of the first through hole 10H and an inner surface 20S of the second through hole 20H. Here, the inner surface 20S of the second through hole 20H may include a surface of the second substrate 20 that defines the second through hole 20H. In addition, the blocking member SHP may extend from the first substrate 10 to the cover window 50. In an embodiment, the blocking member SHP may contact the adhesive layer 40.

The blocking member SHP may include a black pigment. In this case, the black pigment may absorb visible light. Therefore, the blocking member SHP may prevent light occurring from the second area A2 from being incident to the component COMP. The blocking member SHP may include, for example, carbon black formed by incompletely burning hydrocarbons such as methane, acetylene, etc. For another example, the blocking member SHP may include natural graphite.

The blocking member SHP may be a moisture-proof insulating material. Therefore, the blocking member SHP may prevent foreign substance or moisture from penetrating from the first area A1 to the second area A2 through the third area A3. The moisture-proof insulating material may include, for example, an ultraviolet (UV) resin. In this case, in the case where at least one of the first substrate 10 and the second substrate 20 includes glass, adhesive force between the blocking member SHP and the at least one of the first substrate 10 and the second substrate 20 may be enhanced.

The component COMP may be arranged in the first area A1. Particularly, the component COMP may be arranged in the first through hole 10H. In an embodiment, the component COMP may be formed across the first through hole 10H and the second through hole 20H. In an embodiment, the component COMP may be arranged to pass through the third through hole 30H to neighbor the cover window 50. In an embodiment, the component COMP may contact the cover window 50.

The component COMP may include an electronic element. For example, the component COMP may include an electronic element that uses light or sound. The electronic element may include a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound. The electronic element that uses light may use light in various wavelength bands including visible light, infrared light, and ultraviolet light. In an embodiment, the first area A1 may include a transmission area through which light output from the component COMP or light from the outside may pass.

In another embodiment, in the case where the display device 1 is used as a smartwatch or an instrument panel for an automobile, the component COMP may include a member such as clock hands or a needle indicating predetermined information (e.g. the velocity of a vehicle, etc.). In the case where the display device 1 includes clock hands or an instrument panel for an automobile, the component COMP may pass through the cover window 50 and be exposed to the outside. The cover window 50 may include a fifth through hole connected to the fourth through hole 40H.

As described above, the component COMP may include an element(s) which may add a predetermined function to the display device 1 or include an element such as an accessory that increases the aesthetic sense of the display device 1.

An embodiment may include the first substrate 10 and the second substrate 20, the first substrate 10 including the first through hole 10H, and the second substrate 20 including the second through hole 20H. In addition, the component COMP may be disposed across the first through hole 10H and the second through hole 20H. In an embodiment, distortion of light, etc. incident to the component COMP may be prevented or minimized. Unlike the embodiment, in the case where the first substrate 10 and the second substrate 20 do not include a through hole, the component COMP may be arranged below the first substrate 10 to correspond to the first area A1. In this case, light incident from the outside may be refracted while passing through the first substrate 10 and the second substrate 20. Therefore, distortion of light received by the component COMP may occur. According to an embodiment, the component COMP may be disposed adjacent to the cover window 50 to prevent or minimize distortion of light, etc. incident to the component COMP.

In addition, in the case where the first substrate 10 and the second substrate 20 do not include a through hole, foreign substance may be arranged or scratches may be formed between the first substrate 10 and the second substrate 20 while the display device 1 is manufactured. The foreign substance or scratches may cause distortion of light received by the component COMP. Therefore, a polishing process for removing foreign substance or scratches may be added during a process of manufacturing the display device 1. According to an embodiment, since the first substrate 10 includes the first through hole 10H and the second substrate 20 includes the second through hole 20H, foreign substance may be prevented from being arranged in the first area A1, and light received by the component COMP may be prevented from being distorted by foreign substance or scratches.

Figure 2B:
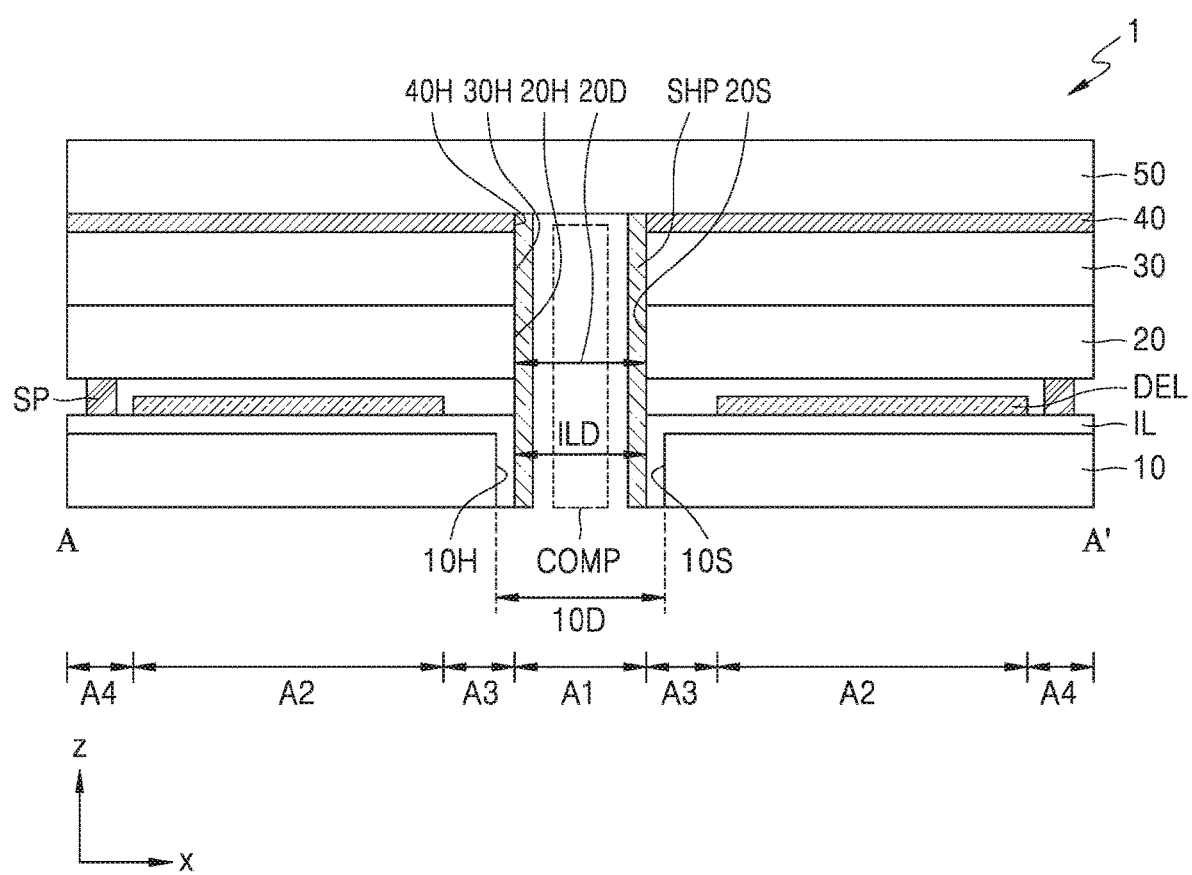
FIG. 2B is a cross-sectional view of a display device according to another embodiment.

FIG. 2B is a cross-sectional view of the display device 1 according to another embodiment. In FIG. 2B, since same reference numerals as those of FIG. 2A denote the same elements, repeated descriptions thereof are omitted.

Referring to FIG. 2B, the display device 1 may include the first substrate 10, the inorganic insulating layer IL, the display element layer DEL, the sealing member SP, the second substrate 20, the optical functional layer 30, the adhesive layer 40, the cover window 50, the blocking member SHP, and the component COMP.

In the present embodiment, the size of the second through hole 20H may be less than the size of the first through hole 10H. In this case, the diameter 20D of the second through hole 20H may be equal to a distance ILD between upper surfaces of the inorganic insulating layer IL that face each other. In this case, the blocking member SHP may extend in the z-direction from the first substrate 10.

Figure 2C:
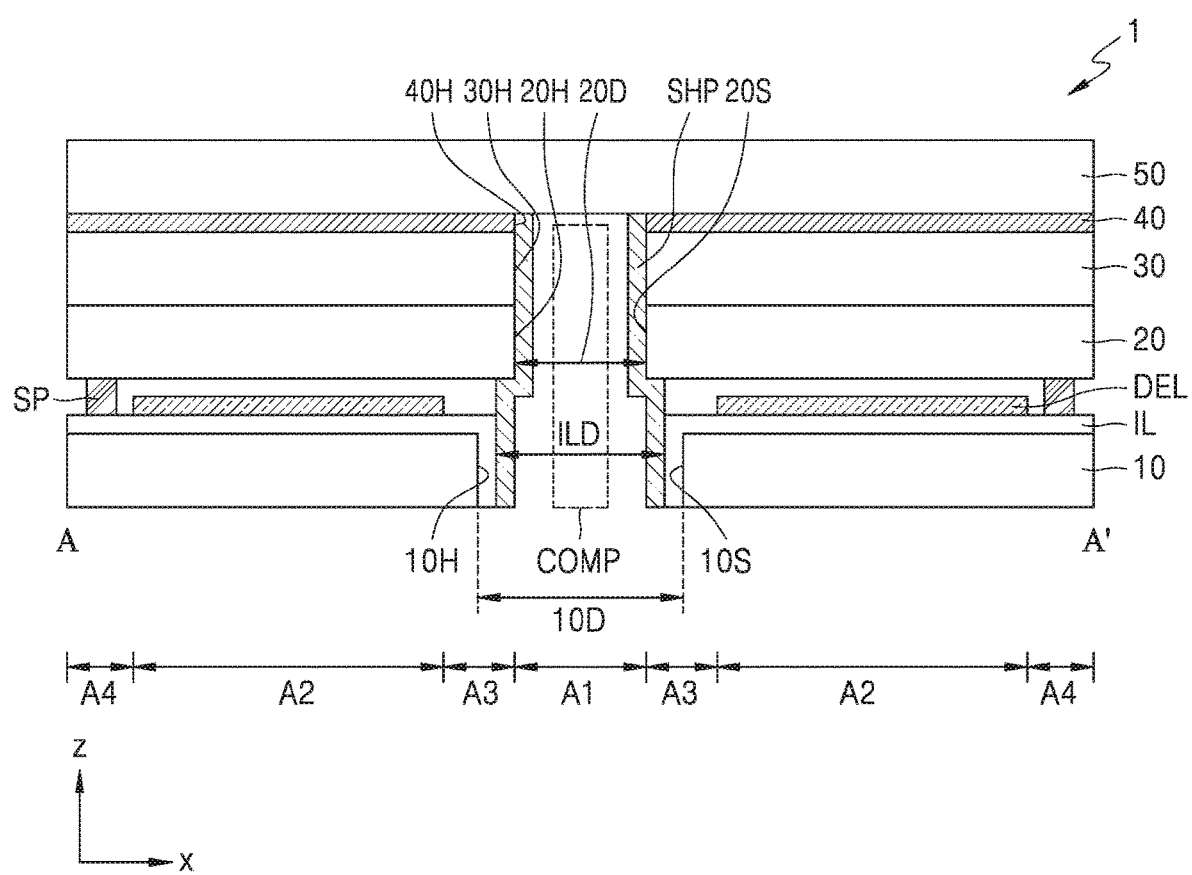
FIG. 2C is a cross-sectional view of a display device according to another embodiment.

FIG. 2C is a cross-sectional view of the display device 1 according to another embodiment. In FIG. 2C, since same reference numerals as those of FIG. 2B denote the same elements, repeated descriptions thereof are omitted.

Referring to FIG. 2C, the display device 1 may include the first substrate 10, the inorganic insulating layer IL, the display element layer DEL, the sealing member SP, the second substrate 20, the optical functional layer 30, the adhesive layer 40, the cover window 50, the blocking member SHP, and the component COMP.

In the present embodiment, the size of the second through hole 20H may be less than the size of the first through hole 10H. In this case, the diameter 20D of the second through hole 20H may be less than a distance ILD between upper surfaces of the inorganic insulating layer IL that face each other.

Figure 2D:
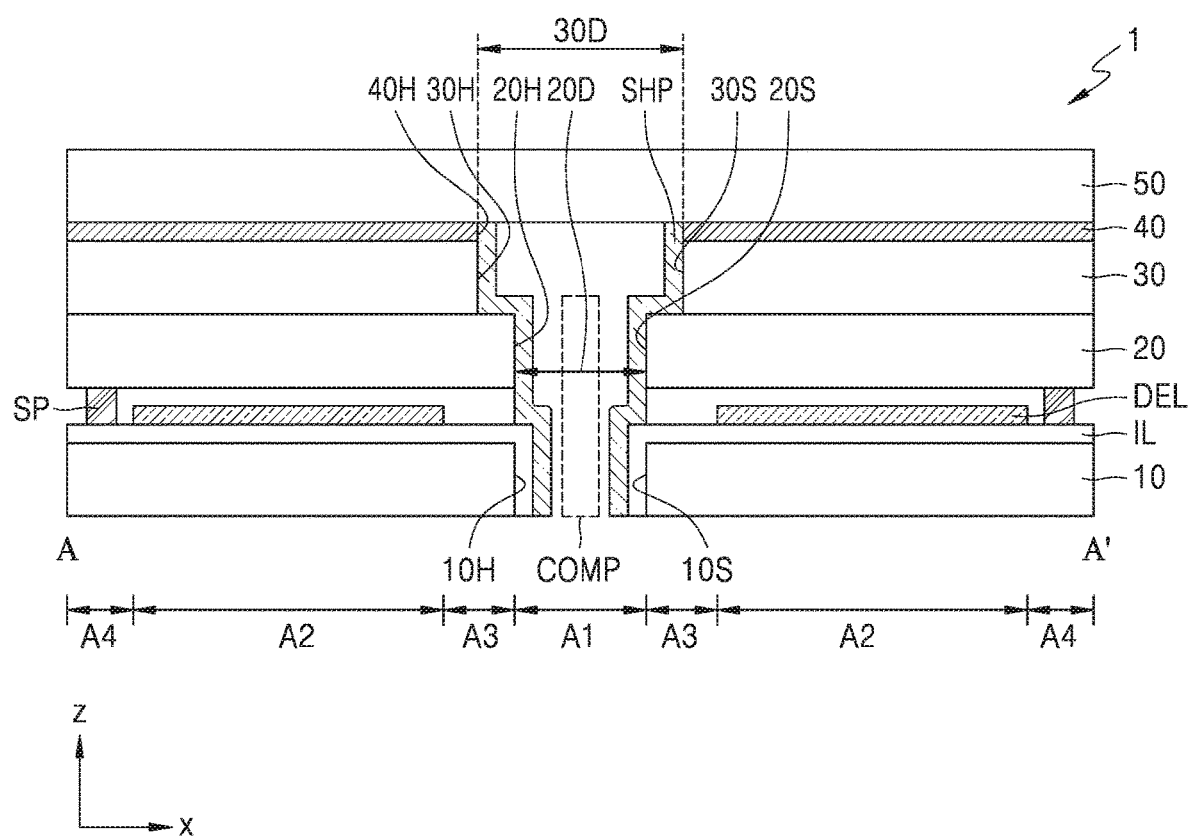
FIG. 2D is a cross-sectional view of a display device according to another embodiment.

FIG. 2D is a cross-sectional view of the display device 1 according to another embodiment. In FIG. 2D, since same reference numerals as those of FIG. 2C denote the same elements, repeated descriptions thereof are omitted.

Referring to FIG. 2D, the display device 1 may include the first substrate 10, the inorganic insulating layer IL, the display element layer DEL, the sealing member SP, the second substrate 20, the optical functional layer 30, the adhesive layer 40, the cover window 50, the blocking member SHP, and the component COMP.

In the present embodiment, the size of the third through hole 30H may be greater than the size of the second through hole 20H. In this case, the size of the third through hole 30H may be the area of a cross-section of the third through hole 30H that is perpendicular to the z-direction. FIG. 2D shows the size of the third through hole 30H is a diameter 30D of the third through hole 30H. In this case, the diameter 30D of the third through hole 30H may be greater than the diameter 20D of the second through hole 20H.

In the present embodiment, the component COMP may be arranged to pass through the first through hole 10H and the second through hole 20H. In this case, the component COMP may be disposed spaced apart from the cover window 50. In the case where the component COMP includes, for example, a camera, the optical functional layer 30 may not limit an angel of view of the camera by making the diameter 30D of the third through hole 30H greater than the diameter 20D of the second through hole 20H. Therefore, the optical functional layer 30 may not damage a captured image of the camera.

Hereinafter, for convenience of description, the case where the diameter 10D of the first through hole 10H is equal to the diameter 20D of the second through hole 20H is mainly described in detail.

Figure 3:
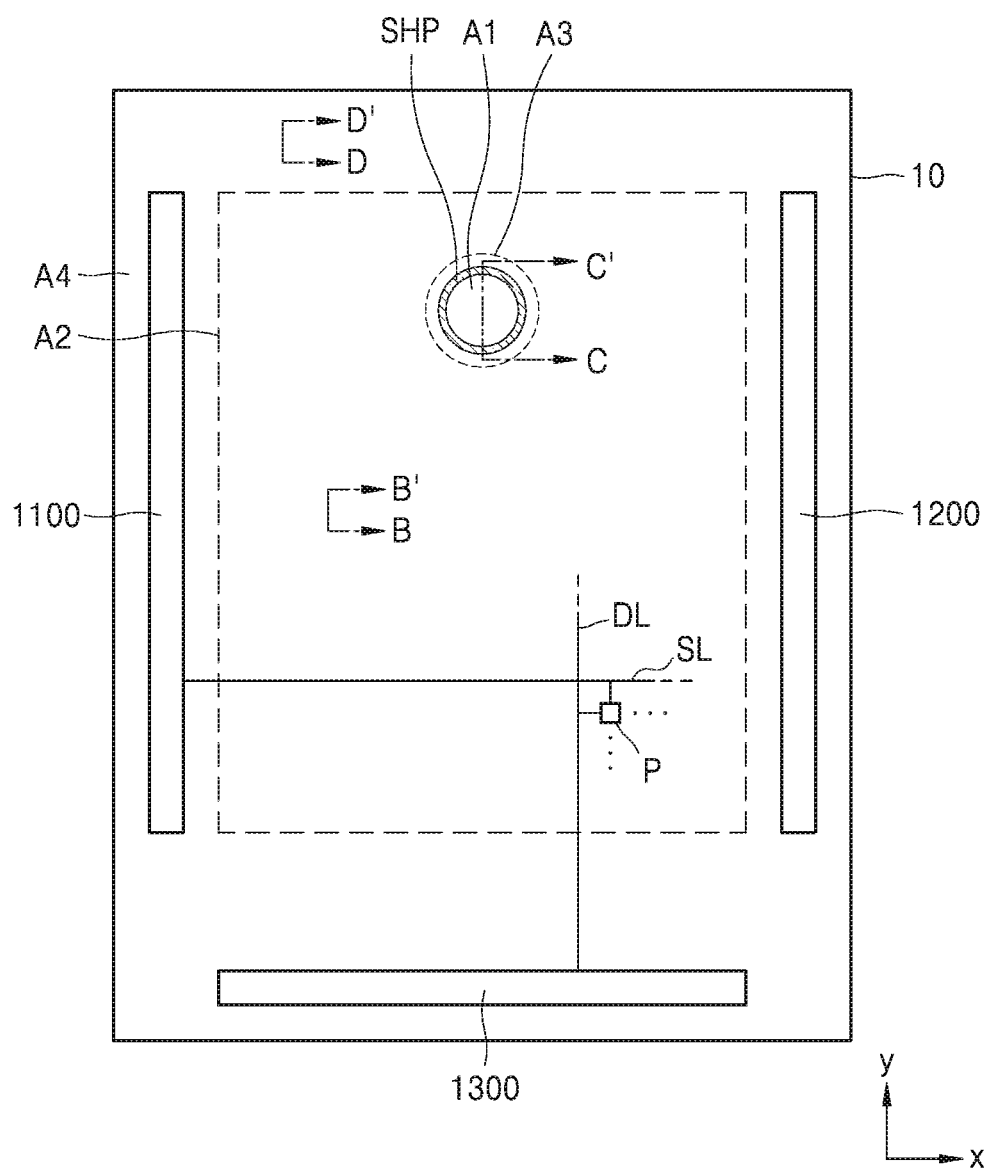
FIG. 3 is a plan view of a first substrate according to an embodiment.
Figure 4:
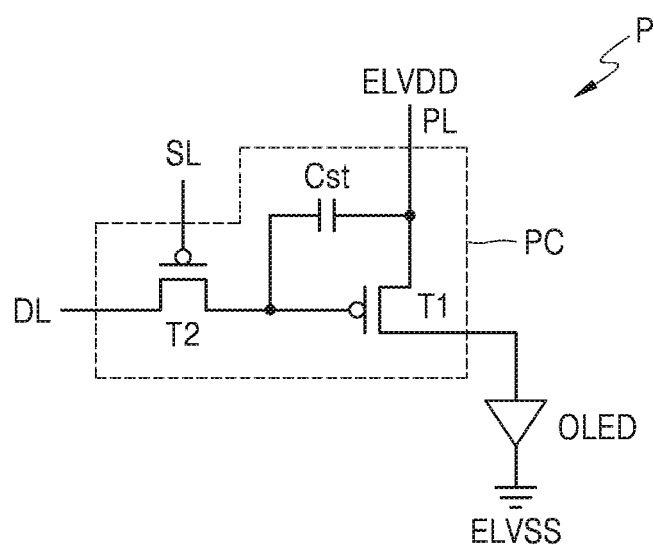
FIG. 4 is an equivalent circuit diagram of a pixel applicable to the first substrate.

FIG. 3 is a plan view of the first substrate 10 according to an embodiment, and FIG. 4 is an equivalent circuit diagram of a pixel P applicable to the first substrate 10.

Referring to FIG. 3, the first substrate 10 may include the first area A1, the second area A2, the third area A3, and the fourth area A4, the second area A2 surrounding the first area A1, the third area A3 being disposed between the first area A1 and the second area A2, and the fourth area A4 surrounding at least a portion of the second area A2. In addition, the first substrate 10 may include the first through hole 10H and the blocking member SHP, the first through hole 10H corresponding to the first area A1, and the blocking member SHP being arranged along the inner surface of the first through hole 10H. A plurality of pixels P may be arranged in the second area A2. The plurality of pixels P may not be disposed in the first area A1, the third area A3 and the fourth area A4.

Referring to FIG. 4, each pixel P may include a pixel circuit PC and a display element, for example, an organic light-emitting diode OLED, the display element being connected to the pixel circuit PC. The pixel circuit PC may include a first thin film transistor T1, a second thin film transistor T2, and a storage capacitor Cst. Each pixel P may emit red, green, blue, or white light.

The second thin film transistor T2 serves as a switching thin film transistor, is connected to a scan line SL and a data line DL, and may transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 serves as a driving thin film transistor, may be connected to the driving voltage line PL and the storage capacitor Cst, and may control a driving current flowing through an organic light-emitting diode OLED from the driving voltage line PL in response to the voltage stored in the storage capacitor Cst. The organic light-emitting diode OLED may emit light having a predetermined brightness according to the driving current flowing through the organic light-emitting diode OLED. An opposite electrode (e.g. a cathode) of the organic light-emitting diode OLED may receive a second power voltage ELVSS.

Though it is described in FIG. 4 that the pixel circuit PC includes two thin film transistors and one storage capacitor, the number of thin film transistors and the number of storage capacitors may be variously changed depending on a design of the pixel circuit PC in another embodiment.

Referring to FIG. 3 again, the third area A3 may surround the first area A1. The third area A3 includes a region in which a display element such as an organic light-emitting diode that emits light is not arranged. Wirings which provide signals to pixels P arranged around the first area A1 may be arranged in the third area A3.

The present embodiment may include the blocking member SHP arranged along the inner surface of the first through hole 10H. Since the blocking member SHP includes a black pigment, the blocking member SHP may prevent diffused reflection caused by display elements or wirings arranged around the first through hole 10H. In addition, since the blocking member SHP includes a moisture-proof insulating material, the blocking member SHP may prevent air or moisture from penetrating from the first area A1 to the second area A2.

A first scan driver 1100, a second scan driver 1200, a data driver 1300, and a main power wiring (not shown) may be arranged in the fourth area A4. The first and second scan drivers 1100 and 1200 each provides a scan signal to each pixel P. The data driver 1300 provides a data signal to each pixel P. The main power wiring provides first and second power voltages to the each pixel P. The first scan driver 1100 and the second scan driver 1200 may be arranged in the fourth area A4 and respectively arranged on two opposite sides of the second area A2 with the second area A2 interposed therebetween.

Though it is shown in FIG. 3 that the data driver 1300 is located close to one side of the first substrate 10, the data driver 1300 may be arranged on a flexible printed circuit board (FPCB) electrically connected to a pad arranged on one side of the first substrate 10 in another embodiment.

Figure 5:
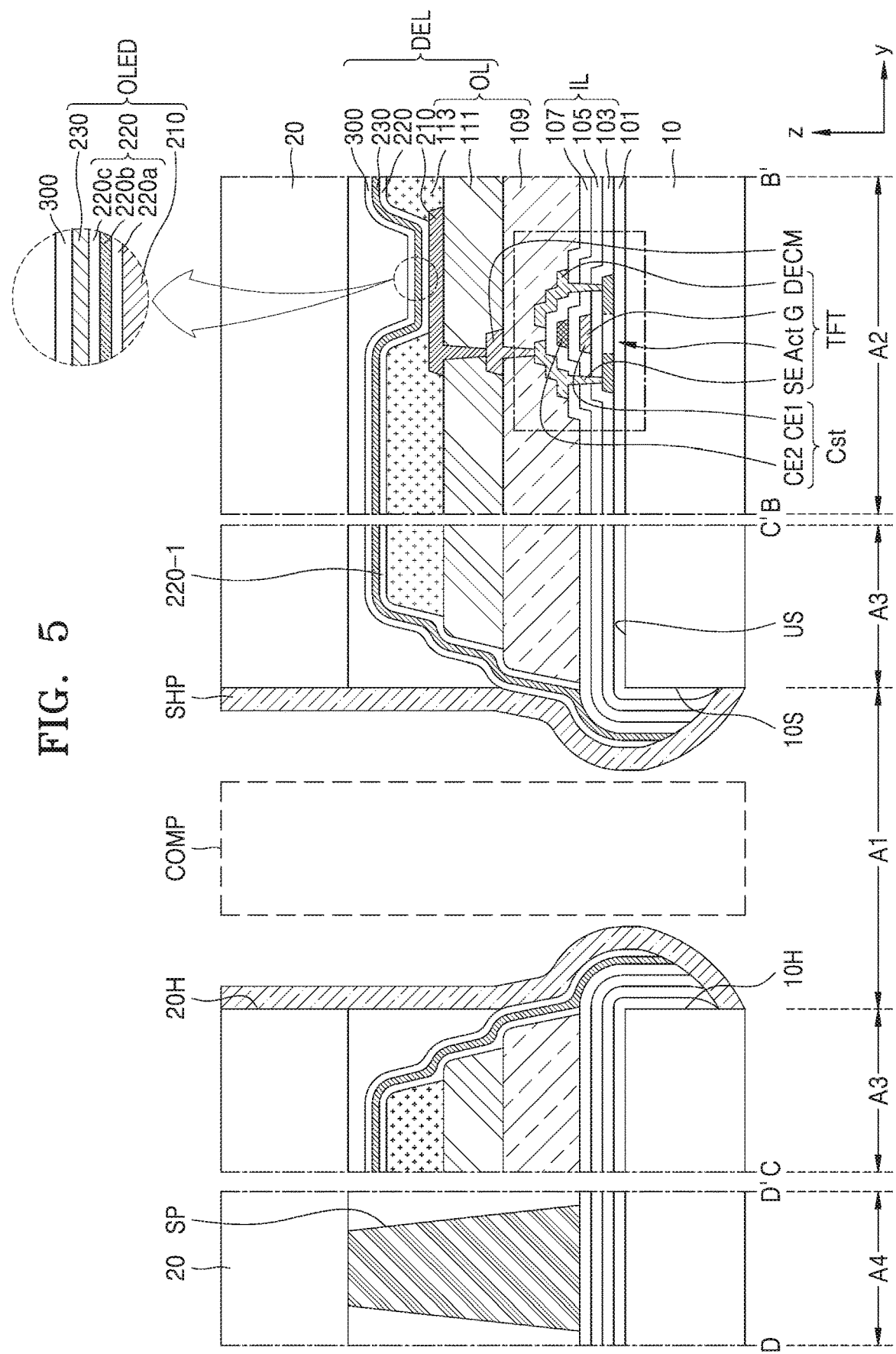
FIG. 5 is a cross-sectional view of the first substrate taken along lines B-B', C-C', and D-D' of FIG. 3.

FIG. 5 is a cross-sectional view of the first substrate 10 taken along lines B-B', C-C', and D-D' of FIG. 3. In FIG. 5, since same reference numerals as those of FIG. 3 denote the same elements, repeated descriptions thereof are omitted.

Referring to FIG. 5, the first substrate 10 may include the second area A2 and the fourth area A4. The second area A2 surrounds the first through hole 10H, and the fourth area A4 surrounds at least a portion of the second area A2. The inorganic insulating layer IL and the display element DEL may be arranged in the second area A2. The display element layer DEL which includes an organic light-emitting diode OLED may be disposed on the inorganic insulating layer IL in the second area A2. The component COMP is arranged to correspond to the first area A1 in a plan view and is disposed across the first through hole 10H and the second through hole 20H. In addition, the blocking member SHP may be arranged along the inner surface 10S of the first through hole 10H and may extend from the first substrate 10 to the second substrate 20.

The first substrate 10 may include glass, plastic, or metal.

A buffer layer 101 may reduce or block penetration of foreign substance, moisture, or external air from below the first substrate 10 and provide a flat surface on the first substrate 10. The buffer layer 101 may include an inorganic material such as an oxide or a nitride, an organic material, or an organic/inorganic composite material and have a single-layered structure or a multi-layered structure of an inorganic material and an organic material. A barrier layer (not shown) may be further provided between the first substrate 10 and the buffer layer 101. The barrier layer blocks penetration of external air. In an embodiment, the buffer layer 101 may include silicon oxide or silicon nitride.

The inorganic insulating layer IL and a thin film transistor TFT may be arranged on the buffer layer 101. The inorganic insulating layer IL may include a first gate insulating layer 103, a second gate insulating layer 105, and an interlayer insulating layer 107. The thin film transistor TFT may include a driving thin film transistor. The thin film transistor TFT may include a semiconductor layer Act, a gate electrode G, a source electrode SE, and a drain electrode DE.

The semiconductor layer Act is arranged on the buffer layer 101 and may include polycrystalline silicon. In another embodiment, the semiconductor layer Act may include amorphous silicon. In another embodiment, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region, a source region, and a drain region. The source region and the drain region may be doped with impurities.

The first gate insulating layer 103 may cover the semiconductor layer Act. The first gate insulating layer 103 may include an inorganic insulating material such as silicon oxide, silicon oxynitride, silicon nitride, aluminum oxide, titanium oxide, tantalum oxide, hafnium oxide, or zinc oxide. The first gate insulating layer 103 may include a single layer or a multi-layer including the above inorganic insulating materials.

The gate electrode G may be arranged on the first gate insulating layer 103 to overlap the semiconductor layer Act. The gate electrode G may include at least one of molybdenum (Mo), aluminum (Al), copper (Cu), and/or titanium (Ti) and include a single layer or a multi-layer. In an embodiment, the gate electrode G may include a single Mo layer.

The second gate insulating layer 105 may cover the gate electrode G. The second gate insulating layer 105 may include an inorganic insulating material such as silicon oxide, silicon oxynitride, silicon nitride, aluminum oxide, titanium oxide, tantalum oxide, hafnium oxide, or zinc oxide. The second gate insulating layer 105 may include a single layer or a multi-layer including the above inorganic insulating materials.

A top electrode CE2 of the storage capacitor Cst may be arranged on the second gate insulating layer 105.

The top electrode CE2 may overlap the gate electrode Gin a plan view. The gate electrode G and the top electrode GE2 overlapping each other with the second gate insulating layer 105 disposed therebetween may constitute the storage capacitor Cst. The gate electrode G may serve as a bottom electrode CE1 of the storage capacitor Cst.

The top electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered structure or a multi-layered structure including the above materials.

The interlayer insulating layer 107 may cover the top electrode CE2. The interlayer insulating layer 107 may include silicon oxide, silicon oxynitride, silicon nitride, aluminum oxide, titanium oxide, tantalum oxide, hafnium oxide, or zinc oxide.

The source electrode SE and the drain electrode DE may be arranged on the interlayer insulating layer 107. The source electrode SE and the drain electrode DE may include a conductive material including at least one of molybdenum (Mo), aluminum (Al), copper (Cu), and titanium (Ti) and include a single layer or a multi-layer including the above materials. For example, the source electrode SE and the drain electrode DE may have a multi-layered structure of Ti/Al/Ti.

The display element layer DEL may be arranged on the inorganic insulating layer IL. The display element layer DEL may include the organic light-emitting diode OLED, the organic insulating layer OL, and an inorganic encapsulation layer 300, the organic light-emitting diode OLED serving as a display element. The organic light-emitting diode OLED may include a pixel electrode 210, an intermediate layer 220, and an opposite electrode 230.

The organic insulating layer OL may be arranged on the inorganic insulating layer IL. In an embodiment, the organic insulating layer OL may include a first planarization layer 109, a second planarization layer 111, and a pixel-defining layer 113. In another embodiment, the second planarization layer 111 may be omitted. In another embodiment, the organic insulating layer OL may further include a third planarization layer disposed between the second planarization layer 111 and the pixel-defining layer 113.

The first planarization layer 109 may cover the source electrode SE and the drain electrode DE. The first planarization layer 109 may have a flat upper surface.

The first planarization layer 109 may include a single layer or a multi-layer including an organic material. The first planarization layer 109 may include a general-purpose polymer such as benzocyclobutene (BCB), polyimide, hexamethyldisiloxane (HMDSO), polymethylmethacrylate or polystyrene, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the first planarization layer 109 may include a single layer or a multi-layer including an inorganic material. In this case, the first planarization layer 109 may include silicon oxide, silicon oxynitride, silicon nitride, aluminum oxide, titanium oxide, tantalum oxide, hafnium oxide, or zinc oxide. After the first planarization layer 109 is formed, chemical mechanical polishing may be performed to provide a flat upper surface.

A connection metal CM may be arranged on the first planarization layer 109. The connection metal CM may be electrically connected to the thin film transistor TFT by contacting the source electrode SE or the drain electrode DE of the thin film transistor TFT through an opening formed in the first planarization layer 109.

A wiring (not shown) may be further arranged on the first planarization layer 109, the wiring being spaced apart from the connection metal CM and including the same material as the connection metal CM.

The second planarization layer 111 may be arranged on the connection metal CM. The second planarization layer 111 may have a flat upper surface such that the pixel electrode 210 arranged thereon is formed flat.

The second planarization layer 111 may include a single layer or a multi-layer including an organic material. In this case, the second planarization layer 111 may include a general-purpose polymer such as benzocyclobutene (BCB), polyimide, hexamethyldisiloxane (HMDSO), polymethylmethacrylate or polystyrene, polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In another embodiment, the second planarization layer 111 may include a single layer or a multi-layer including an inorganic material. In this case, the second planarization layer 111 may include silicon oxide, silicon oxynitride, silicon nitride, aluminum oxide, titanium oxide, tantalum oxide, hafnium oxide, or zinc oxide. After the second planarization layer 111 is formed, chemical mechanical polishing may be performed to provide a flat upper surface.

An opening exposing the connection metal CM may be formed in the second planarization layer 111. The pixel electrode 210 may be electrically connected to the thin film transistor TFT by contacting the connection metal CM through the opening.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 210 may further include a layer including ITO, IZO, ZnO, or $In_2O_3$ on/under the reflective layer. In an embodiment, the pixel electrode 210 may have a structure of ITO/Ag/ITO that are stacked.

The pixel-defining layer 113 may be formed on the pixel electrode 210. The pixel-defining layer 113 includes an opening that exposes an upper surface of the pixel electrode 210 and may cover edges of the pixel electrode 210. In an embodiment, the pixel-defining layer 113 may include an organic insulating material. In another embodiment, the pixel-defining layer 113 may include an inorganic insulating material such as silicon oxide, silicon oxynitride, and silicon nitride. Alternatively, the pixel-defining layer 113 may include an organic insulating material and an inorganic insulating material.

Hereinafter, for convenience of description, the case where the first planarization layer 109, the second planarization layer 111, and the pixel-defining layer 113 include an organic insulating material is mainly described in detail.

The intermediate layer 220 may include an emission layer 220b. The emission layer 220b may include, for example, an organic material. The emission layer 220b may include a polymer organic material or a low molecular weight organic material emitting light having a predetermined color. The intermediate layer 220 may include a first functional layer 220a and/or a second functional layer 220c. The first functional layer 220a is disposed under the emission layer 220b and the second functional layer 220c is disposed on the emission layer 220b.

The first functional layer 220a may include a single layer or a multi-layer. For example, in the case where the first functional layer 220a includes a polymer material, the first functional layer 220a may include a hole transport layer (HTL), which has a single-layered structure, and include poly(3,4-ethylenedioxythiophene) (PEDOT) or polyaniline (PANI). In the case where the first functional layer 220a includes a low molecular weight material, the first functional layer 222a may include a hole injection layer (HIL) and a hole transport layer (HTL).

The second functional layer 220c may be omitted. For example, in the case where the first functional layer 220a and the emission layer 220b include a polymer material, the second functional layer 220c may be formed. The second functional layer 220c may include a single layer or a multi-layer. The second functional layer 220c may include an electron transport layer (ETL) and/or an electron injection layer (EIL).

The emission layer 220b of the intermediate layer 220 may be arranged for each pixel in the second area A2. The emission layer 220b may overlap the opening of the pixel-defining layer 113 and/or the pixel electrode 210.

The opposite electrode 230 may include a conductive material having a low work function. For example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may further include a layer including ITO, IZO, ZnO, or $In_2O_3$ on the (semi) transparent layer. The opposite electrode 230 is provided as a single body to cover a plurality of pixel electrodes 210 in the second area A2. The intermediate layer 220 and the opposite electrode 230 may be formed by thermal deposition.

In an embodiment, the inorganic encapsulation layer 300 may be arranged on the opposite electrode 230, the inorganic encapsulation layer 300 covering the organic light-emitting diode OLED. The inorganic encapsulation layer 300 may be arranged along the shape of an upper surface of the opposite electrode 230. Therefore, the inorganic encapsulation layer 300 may prevent moisture from penetrating into the organic light-emitting diode OLED. The inorganic encapsulation layer 300 may include one or more inorganic insulating materials. The inorganic insulating materials may include aluminum oxide, titanium oxide, tantalum oxide, hafnium oxide, zinc oxide, silicon oxide, silicon oxynitride, and/or silicon nitride. The inorganic encapsulation layer 300 may be formed by using chemical vapor deposition. In an embodiment, the inorganic encapsulation layer 300 may be omitted.

The second substrate 20 may be arranged over the opposite electrode 230 and may include a transparent material. For example, the second substrate 20 may include glass or a plastic material.

The sealing member SP arranged in the fourth area A4 may attach the first substrate 10 to the second substrate 20. In this case, the sealing member SP may be arranged on the inorganic insulating layer IL in the fourth area A4.

In the present embodiment, the buffer layer 101 and the inorganic insulating layer IL may extend from the second area A2 to the first area A1. In addition, the buffer layer 101 and the inorganic insulating layer IL may extend to the inner surface 10S of the first through hole 10H. The buffer layer 101 and the inorganic insulating layer IL may surround an upper surface US of the first substrate 10 including the upper surface US neighboring the first through hole 10H and the inner surface 10S of the first through hole 10H. Therefore, the penetration of foreign substance or moisture into the thin film transistor TFT may be prevented. The buffer layer 101 and the inorganic insulating layer IL may be formed on the first substrate 10 including the first through hole 10H and accordingly be arranged on the inner surface 10S of the first through hole 10H.

In the present embodiment, the organic insulating layer OL may extend to the third area A3. A functional layer 220-1 including the first functional layer 220a and the second functional layer 220c may also extend to the third area A3.

In the present embodiment, the opposite electrode 230 and the inorganic encapsulation layer 300 may extend from the second area A2 to the first area A1. In addition, the opposite electrode 230 and the inorganic encapsulation layer 300 may extend to the inner surface 10S of the first through hole 10H. The opposite electrode 230 and the inorganic encapsulation layer 300 may surround the upper surface US of the first substrate 10 including the upper surface US neighboring the first through hole 10H and the inner surface 10S of the first through hole 10H. In this case, the opposite electrode 230 may contact the inorganic insulating layer IL on the inner surface 10S of the through hole 10H. Therefore, the inorganic insulating layer IL and the opposite electrode 230 may prevent foreign substance or moisture from penetrating from the first area A1 to the second area A2.

In the present embodiment, the blocking member SHP including the moisture-proof insulating material may be arranged on the inner surface 10S of the first through hole 10H and arranged to cover the inorganic encapsulation layer 300 and/or the inorganic insulating layer IL. The blocking member SHP may prevent foreign substance or moisture from penetrating from the first area A1 to the second area A2. Therefore, the sealing member SP may not be arranged in the third area A3.

Figure 6:
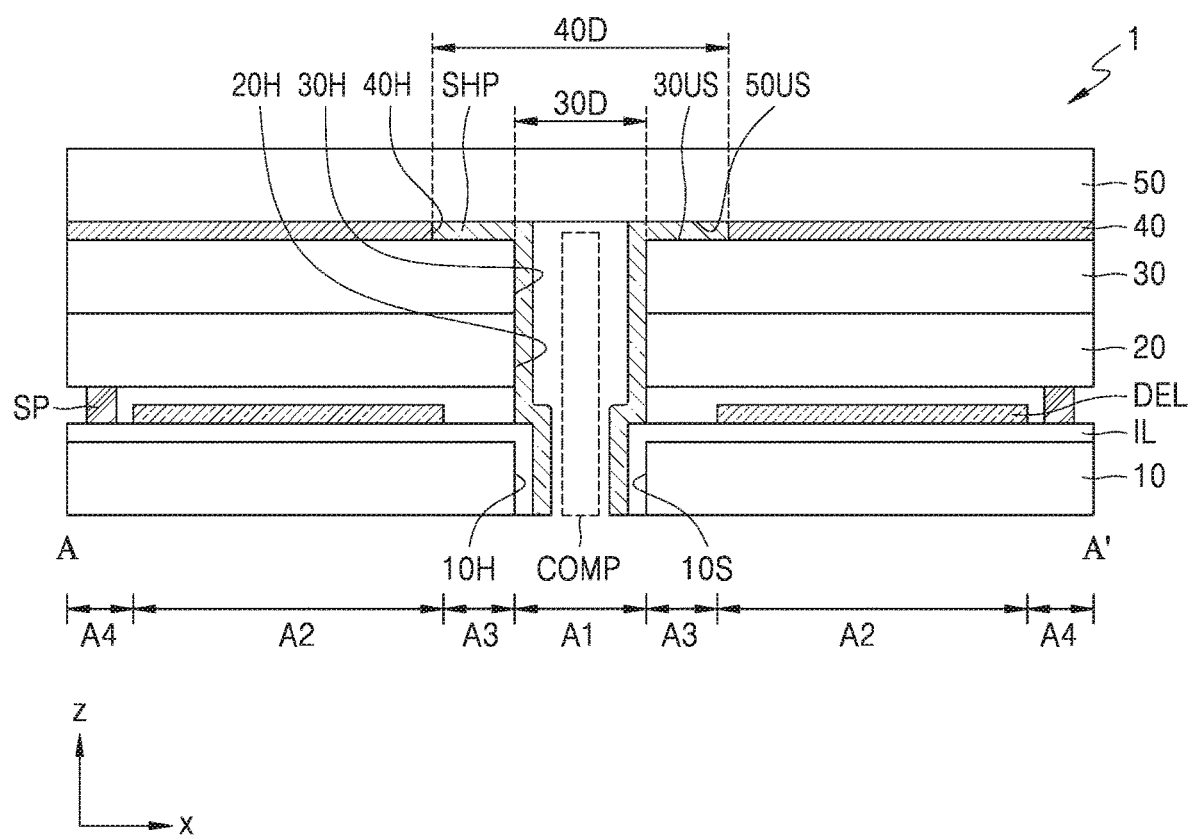
FIG. 6 is a cross-sectional view of a display device according to another embodiment.

FIG. 6 is a cross-sectional view of the display device 1 according to another embodiment. In FIG. 6, since same reference numerals as those of FIG. 2A denote the same elements, repeated descriptions thereof are omitted.

Referring to FIG. 6, the display device 1 may include the first substrate 10, the inorganic insulating layer IL, the display element layer DEL, the sealing member SP, the second substrate 20, the optical functional layer 30, the adhesive layer 40, the cover window 50, the blocking member SHP, and the component COMP.

The first substrate 10 may include the second area A2 and the fourth area A4. The second area A2 surrounds the first through hole 10H and the fourth area A4 surrounds at least a portion of the second area A2. In this case, the first through hole 10H may be arranged to correspond to the first area A1 in a plan view. In addition, a plurality of organic light-emitting diodes as display elements may be arranged in the display element layer DEL in the second area A2 of the first substrate 10. In this case, the inorganic insulating layer IL arranged between the first substrate 10 and the display element layer DEL may extend from the second area A2 to the inner surface 10S of the first through hole 10H.

The second substrate 20 including the second through hole 20H may be arranged over the first substrate 10. The second through hole 20H may be connected to the first through hole 10H. In this case, the second through hole 20H may be arranged to correspond to the first through hole 10H in a plan view.

The optical functional layer 30 may be arranged on the second substrate 20 and may include the third through hole 30H connected to the second through hole 20H. In this case, the third through hole 30H may be arranged to correspond to the second through hole 20H in a plan view.

The adhesive layer 40 may be arranged on the third optical functional layer 30 and may include the fourth through hole 40H connected to the third through hole 30H. In this case, the fourth through hole 40H may be arranged to correspond to the third through hole 30H in a plan view.

In the present embodiment, the size of the fourth through hole 40H may be greater than the size of the third through hole 30H. In this case, the size of the third through hole 30H may be defined as the area of a cross-section of the third through hole 30H that is perpendicular to the z-direction. The size of the fourth through hole 40H may be the area of a cross-section of the fourth through hole 40H that is perpendicular to the z-direction. For convenience of description, in FIG. 6, the size of the fourth through hole 40H and the size of the third through hole 30H are respectively shown as a diameter 40D of the fourth through hole 40H and a diameter 30D of the third through hole 30H. In this case, the diameter 40D of the fourth through hole 40H may be greater than the diameter 30D of the third through hole 30H.

In the present embodiment, the blocking member SHP may extend from the first through hole 10H of the first substrate 10 to an upper surface 30US of the optical functional layer 30. Therefore, at least a portion of the blocking member SHP may be arranged on the upper surface 30US of the optical functional layer 30. In this case, the blocking member SHP may fill a region defined by the upper surface 30US of the optical functional layer 30, a bottom surface 50US of the cover window 50 that faces the upper surface 30US of the optical functional layer 30, and the fourth through hole 40H of the adhesive layer 40. Therefore, a blocking effect of the blocking member SHP may be increased.

Figure 7:
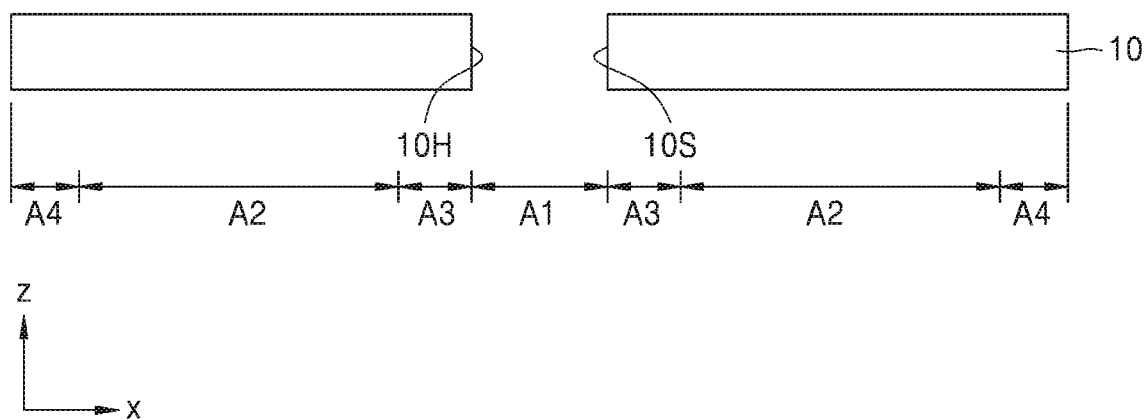
FIGS. 7 and 8 are cross-sectional views of a method of manufacturing a display device according to an embodiment.
Figure 8:
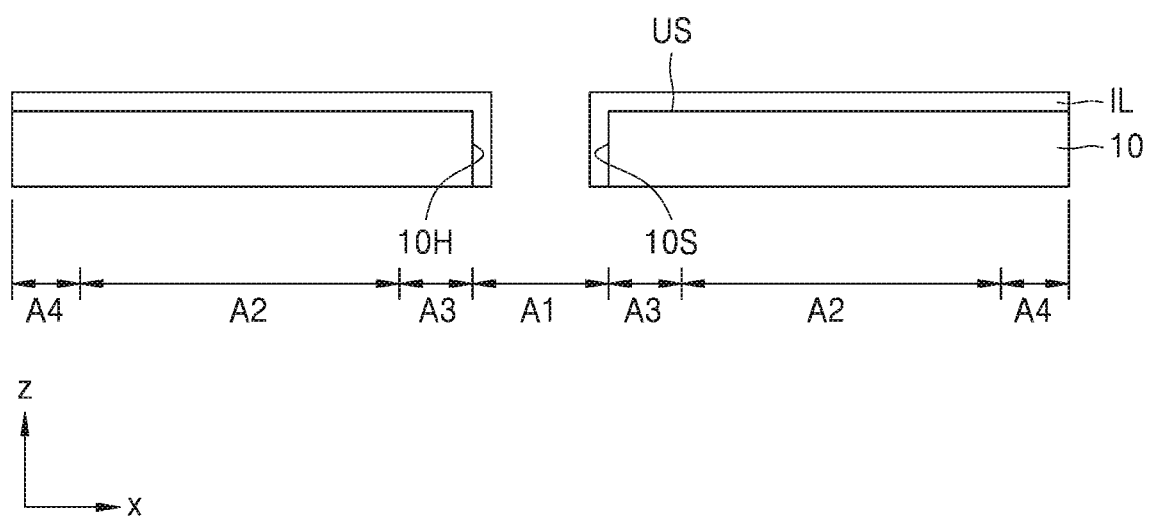
Figure 9A:
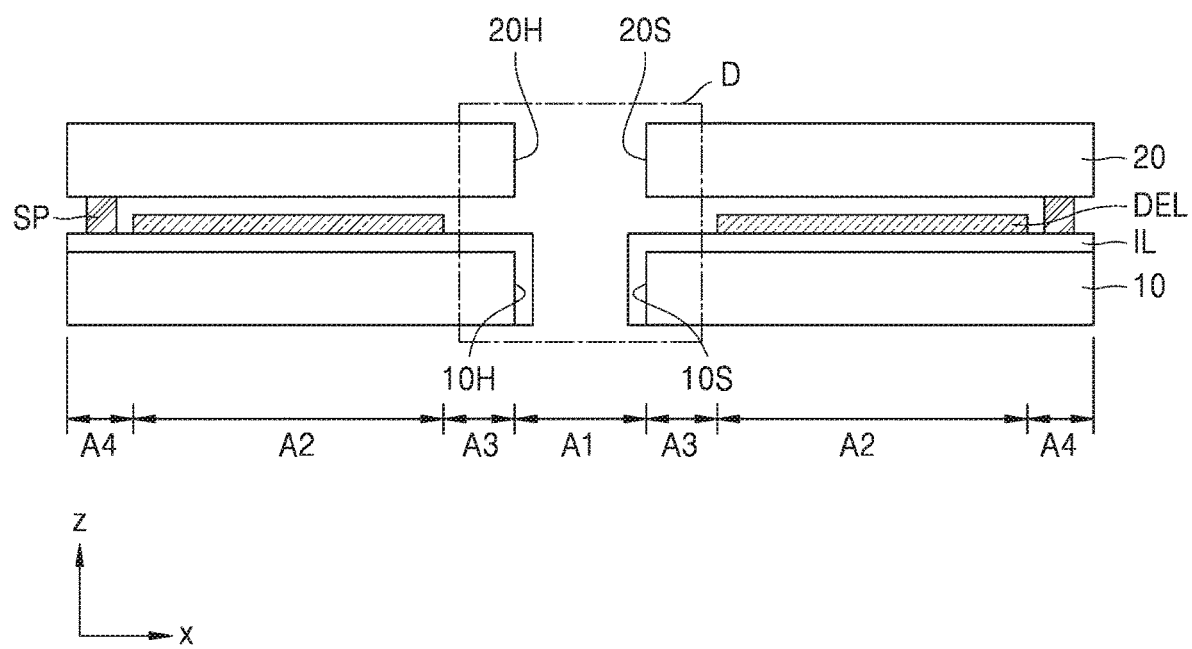
FIG. 9A is a cross-sectional view of a method of manufacturing a display device according to an embodiment.
Figure 9B:
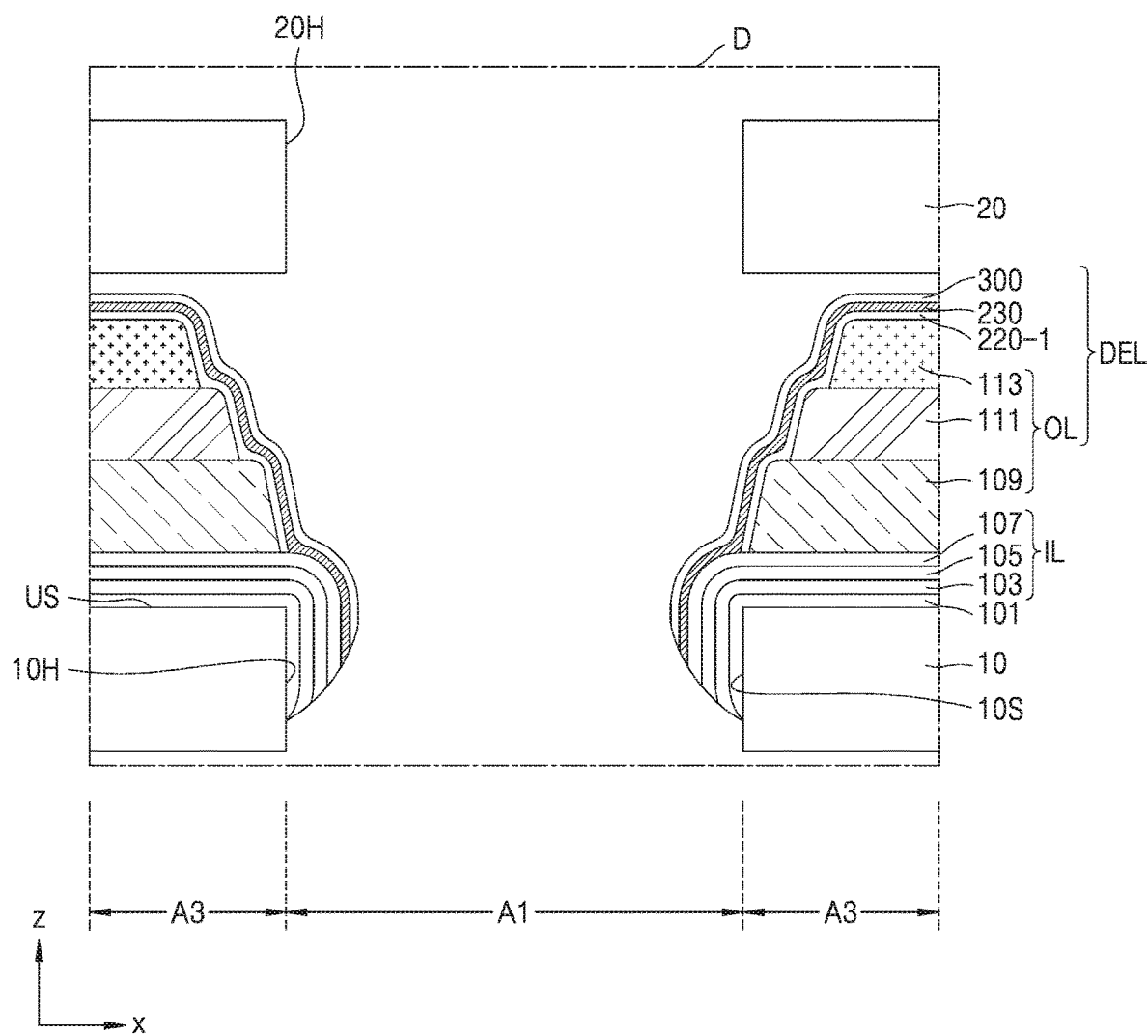
FIG. 9B is an enlarged cross-sectional view of a region D of FIG. 9A in a method of manufacturing a display device according to an embodiment.
Figure 10:
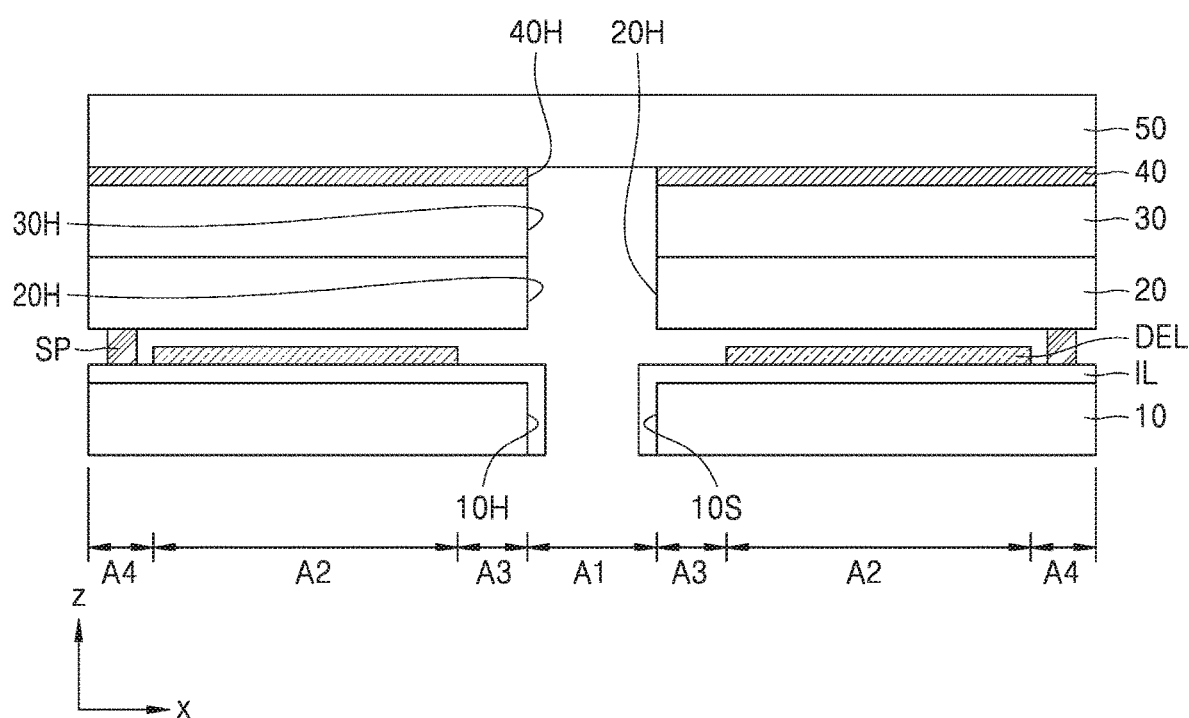
FIGS. 10, 11, and 12 are cross-sectional views of a method of manufacturing a display device according to an embodiment.
Figure 11:
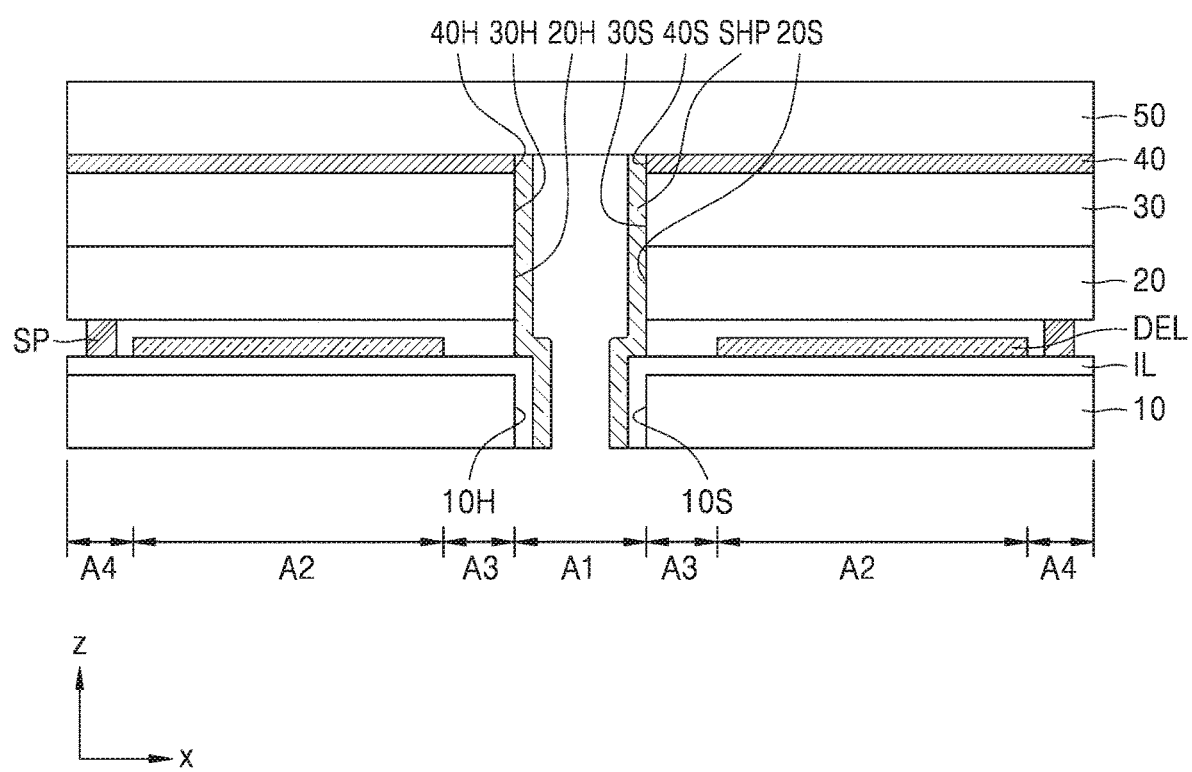
Figure 12:
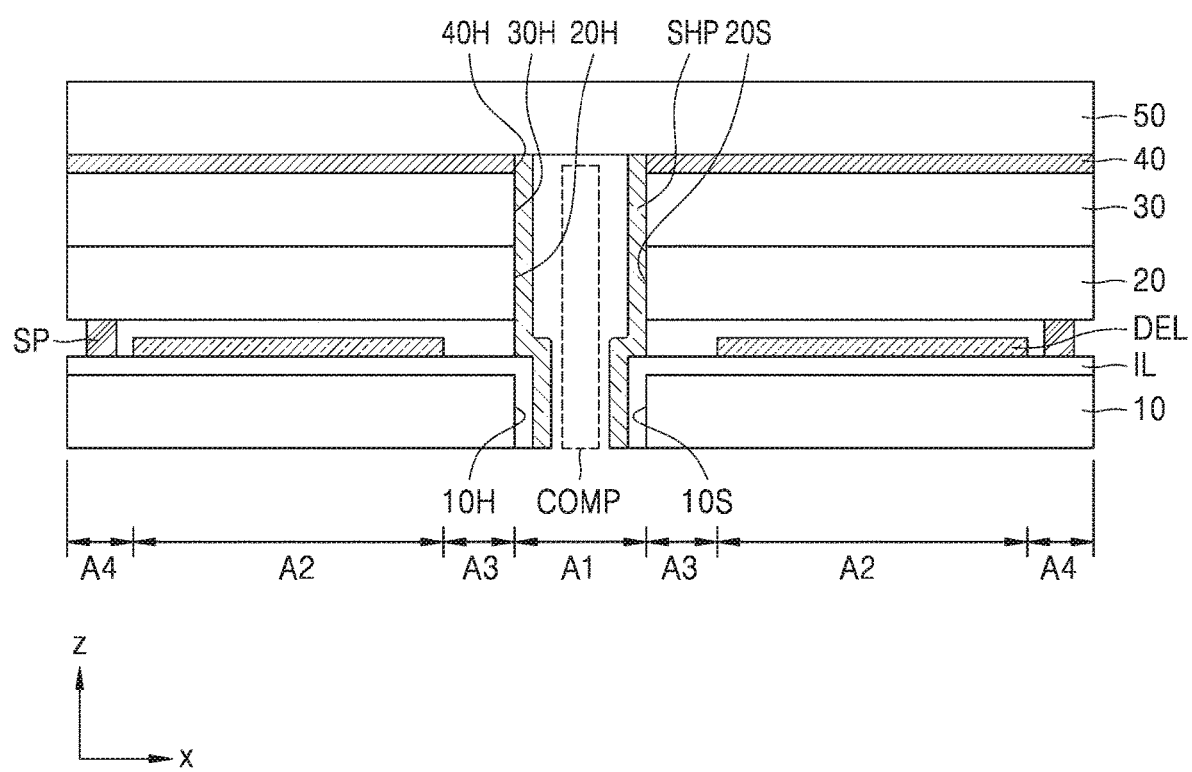

FIGS. 7 and 8 are cross-sectional views of a method of manufacturing the display device 1 according to an embodiment. FIG. 9A is a cross-sectional view of a method of manufacturing a display device according to an embodiment. FIG. 9B is an enlarged cross-sectional view of a region D of FIG. 9A in a method of manufacturing a display device according to an embodiment. FIGS. 10, 11, and 12 are cross-sectional views of a method of manufacturing a display device according to an embodiment.

Referring to FIG. 7, the first substrate 10 in which the first through hole 10H is formed may be prepared. In an embodiment, the first through hole 10H may be formed by using a laser. In another embodiment, the first through hole 10H may be formed by using mechanical polishing. In this case, the first through hole 10H may be formed to correspond to the first area A1. Though it is shown in FIG. 7 that one first through hole 10H is formed, a plurality of first through holes 10H may be formed in the first substrate 10 in another embodiment.

Referring to FIG. 8, the inorganic insulating layer IL may be formed in the second area A2 surrounding the first through hole 10H. In an embodiment, the inorganic insulating layer IL may be formed by using chemical vapor deposition. The inorganic insulating layer IL may be formed along the shape of a layer arranged under the inorganic insulating layer IL. For example, in the case where the inorganic insulating layer IL is formed on the upper surface US of the first substrate 10 including the first through hole 10H, the inorganic insulating layer IL may be formed on the inner surface 10S of the first through hole 10H as well as the upper surface US of the first substrate 10. Therefore, the inorganic insulating layer IL may extend from the second area A2 to the inner surface 10S of the first through hole 10H. That is, the inorganic insulating layer IL may surround the upper surface US of the first substrate 10 including the upper surface US neighboring the first through hole 10H and the inner surface 10S of the first through hole 10H. Therefore, the inorganic insulating layer IL may prevent foreign substance or moisture from penetrating from the first area A1 to the second area A2.

Next, referring to FIGS. 9A and 9B, the display element layer DEL including display elements may be formed in the second area A2. Specifically, an organic insulating layer OL and an organic light-emitting diode of the display element layer DEL may be formed. In addition, the sealing member SP may be formed in the fourth area A4.

In the present embodiment, the inorganic encapsulation layer 300 may be further formed on the organic light-emitting diode. The inorganic encapsulation layer 300 may be formed by using chemical vapor deposition. Therefore, similar to the inorganic insulating layer IL, the inorganic encapsulation layer 300 may extend from the second area A2 to the inner surface 10S of the first through hole 10H. That is, the inorganic encapsulation layer 300 may surround the upper surface US of the first substrate 10 including the upper surface US neighboring the first through hole 10H and the inner surface 10S of the first through hole 10H. Therefore, the inorganic encapsulation layer 300 may prevent foreign substance or moisture from penetrating from the first area A1 to the second area A2.

In addition, the second substrate 20 in which the second through hole 20H is formed may be prepared. In an embodiment, similar to the first through hole 10H, the second through hole 20H may be formed by using a laser. In another embodiment, the second through hole 20H may be formed by using mechanical polishing.

Next, the second substrate 20 may be arranged over the first substrate 10 such that the second through hole 20H corresponds to the first through hole 10H in a plan view. Therefore, the second through hole 20H may be connected to the first through hole 10H. In this case, the first through hole 10H and the second through hole 20H may serve as alignment marks configured to align the first substrate 10 and the second substrate 20.

The first substrate 10 may be coupled to the second substrate 20 by using the sealing member SP. Therefore, an inner space between the first substrate 10 and the second substrate 20 may be sealed.

Next, referring to FIG. 10, the optical functional layer 30 may be formed on the second substrate 20, the optical functional layer 30 including the third through hole 30H connected to the second through hole 20H. The third through hole 30H may be formed to correspond to the second through hole 20H in a plan view.

Next, the adhesive layer 40 including the fourth through hole 40H which is connected to the third through hole 30H may be formed on the optical functional layer 30. The fourth through hole 40H may be formed to correspond to the third through hole 30H in a plan view.

Next, the cover window 50 may be formed on the adhesive layer 40, the cover window 50 covering the second area A2 and the fourth through hole 40H. Specifically, the cover window 50 may entirely cover the adhesive layer 40 and the fourth through hole 40H. In this case, the optical functional layer 30 may be attached to the cover window 50 by using the adhesive layer 40.

Next, referring to FIG. 11, the blocking member SHP may be formed along the inner surface 10S of the first through hole 10H, the inner surface 20S of the second through hole 20H, the inner surface 30S of the third through hole 30H and the inner surface 40S of the fourth through hole 40H. The blocking member SHP may extend from the first substrate 10 to the second substrate 20. In addition, the blocking member SHP may extend from the first substrate 10 to the cover window 50. In an embodiment, the blocking member SHP may contact the adhesive layer 40.

In the present embodiment, the blocking member SHP may cover the inorganic insulating layer IL extending to the inner surface 10S of the first through hole 10H. Therefore, the blocking member SHP may prevent foreign substance or moisture from penetrating from the first area A1 to the second area A2.

In an embodiment, the blocking member SHP may be formed by using a method below. First, a black pigment and a moisture-proof insulating material are coated on an outer circumferential surface of a rotatable rotator. In this case, the rotator may include a roller. In addition, when the rotator is inserted into the first area A1 and then rotated, the blocking member SHP may be formed along the inner surface 10S of the first through hole 10H and the inner surface 20S of the second through hole 20H.

Next, referring to FIG. 12, the component COMP may be disposed across the first through hole 10H and the second through hole 20H. Specifically, the component COMP may be arranged in the first area A1. In addition, the component COMP may be disposed across the first through hole 10H, the second through hole 20H and the third through hole 30H, and neighbor the cover window 50. In an embodiment, the component COMP may be disposed across the first through hole 10H, the second through hole 20H, the third through hole 30H and the fourth through hole 40H to contact the cover window 50.

In an embodiment, the inorganic insulating layer IL and the display element layer DEL are formed on the first substrate 10 in which the first through hole 10H is formed. The second substrate 20 in which the second through hole 20H is formed may be attached to the first substrate 10. Unlike the embodiment described above, in the case where the first through hole 10H and the second through hole 20H are respectively formed in the first substrate 10 and the second substrate 20 after the first substrate which includes the inorganic insulating layer IL and the display element layer DEL and the second substrate 20 are attached each other, there is a possibility that foreign substance or moisture penetrates into the display element of the display element layer DEL. In addition, after the first through hole 10H and the second through hole 20H are formed, an additional subsequent process of polishing a bottom surface of the first substrate 10 and an upper surface of the second substrate 20 may be required. Since the display device is manufactured by using the first substrate 10 in which the first through hole 10H is formed and the second substrate 20 in which the second through hole 20H is formed, the reliability of the display device may be increased. In addition, since an additional subsequent process is not required in a method of manufacturing a display device, efficiency of the method of manufacturing the display device may be increased.

Figure 13A:
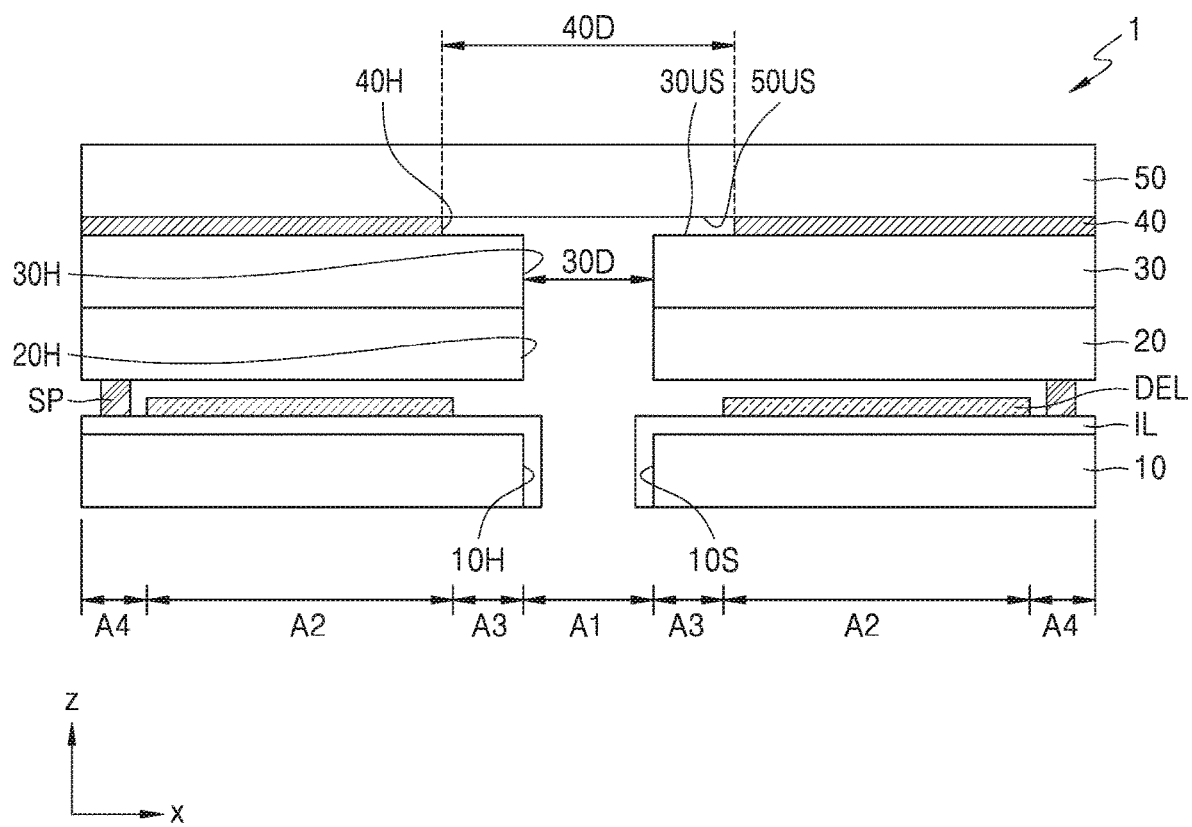
FIGS. 13A and 13B are cross-sectional views of a method of manufacturing a display device according to another embodiment.
Figure 13B:
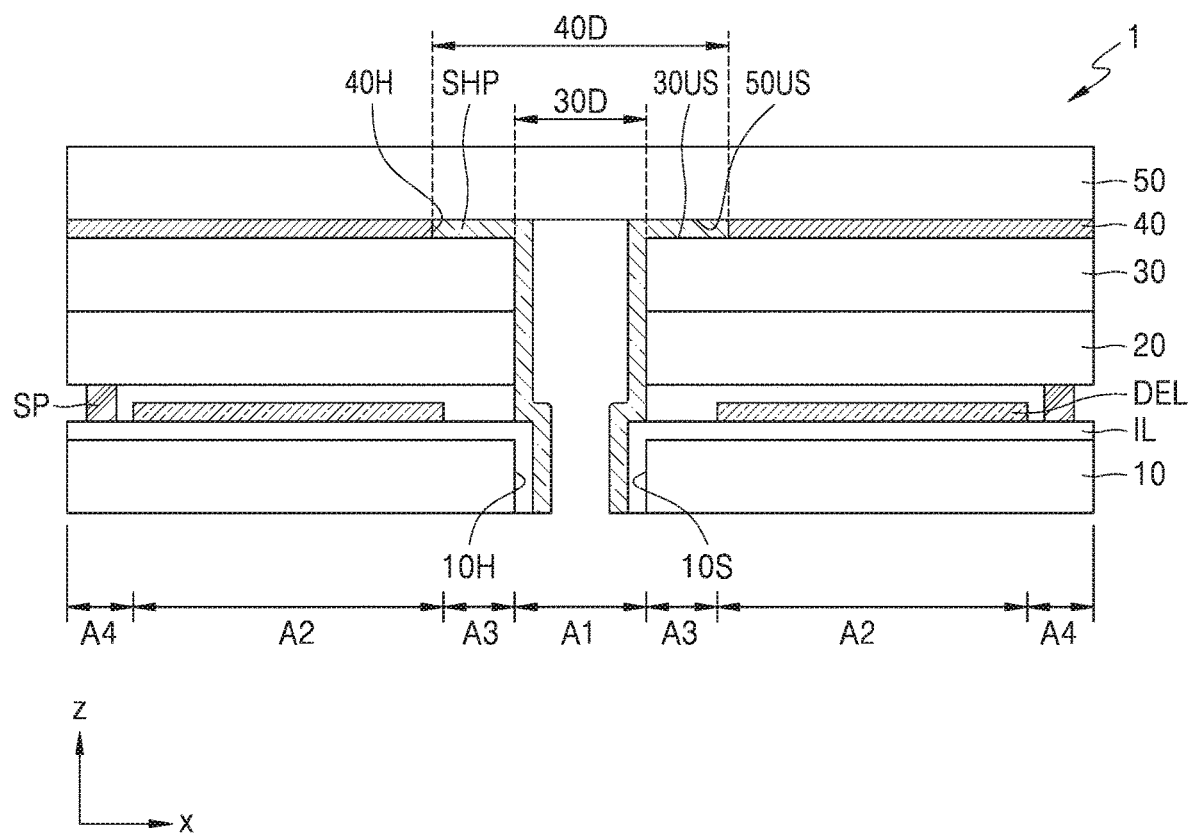

FIGS. 13A and 13B are cross-sectional views of a method of manufacturing the display device according to another embodiment. In FIGS. 13A and 13B, since same reference numerals as those of FIG. 11 denote the same members, repeated descriptions thereof are omitted.

Referring to FIG. 13A, the size of the fourth through hole 40H may be greater than the size of the third through hole 30H. For convenience of description, in FIG. 13A, the size of the fourth through hole 40H and the size of the third through hole 30H are respectively shown as the diameter 40D of the fourth through hole 40H and the diameter 30D of the third through hole 30H. In this case, the diameter 40D of the fourth through hole 40H may be greater than the diameter 30D of the third through hole 30H. Therefore, the upper surface 30US of the optical functional layer 30 may be exposed through the adhesive layer 40.

Referring to FIG. 13B, the blocking member SHP may extend from the inner surface 10S of the first through hole 10H to the upper surface 30US of the optical functional layer 30. At least a portion of the blocking member SHP may be formed on the upper surface 30US of the optical functional layer 30. In this case, the blocking member SHP may fill a region defined by the upper surface 30US of the optical functional layer 30, the bottom surface 50US of the cover window 50 that faces the upper surface 30US of the optical functional layer 30, and the fourth through hole 40H of the adhesive layer 40. Therefore, a blocking effect of the blocking member SHP may be increased.

As described above, since the embodiments include the first substrate including the first through hole and the second substrate including the second through hole connected to the first through hole, a transmittance of the transmission area may be improved and distortion of information, etc. incident to the component may be prevented.

In addition, since the embodiments include the blocking member arranged on the inner surface of the first through hole, diffused reflection caused by a display element or a wiring arranged around the first through hole may be prevented and moisture penetration from the first through hole to the display element may be prevented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
   preparing a first substrate in which a first through hole is formed;
   forming an inorganic insulating layer on the first substrate;
   forming a display element layer on the inorganic insulating layer, the display element layer including a display element;
   preparing a second substrate in which a second through hole is formed;
   aligning the first substrate and the second substrate such that the first through hole corresponds to the second through hole; and
   forming a blocking member along an inner surface of the first through hole and an inner surface of the second through hole.

2. The method of claim 1, wherein the inorganic insulating layer extends from the display area to the inner surface of the first through hole.

3. The method of claim 2, wherein the blocking member covers the inorganic insulating layer extending to the inner surface of the first through hole.

4. The method of claim 1, wherein the forming of the display element layer includes:
   forming an inorganic encapsulation layer on the display element layer,
   wherein the inorganic encapsulation layer extends from the display area to the inner surface of the first through hole.

5. The method of claim 1, further comprising:
   forming an optical functional layer on the second substrate, the optical functional layer including a third through hole connected to the second through hole;
   forming an adhesive layer on the optical functional layer, the adhesive layer including a fourth through hole connected to the third through hole; and
   arranging a cover window on the adhesive layer, the cover window covering the display area and the fourth through hole.

6. The method of claim 5, wherein a size of the fourth through hole is greater than a size of the third through hole, and the blocking member extends from the inner surface of the second through hole to an upper surface of the optical functional layer.

7. The method of claim 1, further comprising arranging a component such that the component passes through the first through hole and the second through hole.

* * * * *